(12) United States Patent
Low et al.

(10) Patent No.: US 7,125,790 B2
(45) Date of Patent: Oct. 24, 2006

(54) INCLUSION OF LOW-K DIELECTRIC MATERIAL BETWEEN BIT LINES

(75) Inventors: Kia Seng Low, Hopewell Junction, NY (US); Larry Nesbit, Williston, VT (US); George C. Feng, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/689,233

(22) Filed: Oct. 20, 2003

(65) Prior Publication Data

US 2005/0085096 A1 Apr. 21, 2005

(51) Int. Cl.
*H01L 21/4763* (2006.01)
(52) U.S. Cl. .................................... 438/622
(58) Field of Classification Search ............... 438/240, 438/243, 254, 386, 387, 672, 778
See application file for complete search history.

(56) References Cited

U.S. PATENT DOCUMENTS 5,880,018 A * 3/1999 Boeck et al. ............... 438/619
2002/0102843 A1* 8/2002 Seta et al. .................. 438/672

* cited by examiner

*Primary Examiner*—Asok Kumar Sarkar

(57) ABSTRACT

Low-k dielectric materials are incorporated as an insulator material between bit lines and an inter-level dielectric material. The device is first processed in a known manner, up to and including the deposition and anneal of the bit line metal, using a higher dielectric constant material that can withstand the higher temperature process steps as the insulator between the bit lines. Then, the higher dielectric constant material is removed using an etch that is selective to the bit line metal, and the low-k dielectric material is deposited. The low-k material may then be planarized to the top of the bit lines, and further low-k material deposited as an inter-level dielectric. Alternatively, sufficient low-k material is deposited in a single step to both fill the gaps between the bit lines as well as serve as an inter-level dielectric, and then the low-k dielectric material is planarized. Standard processing may then be carried out.

23 Claims, 11 Drawing Sheets

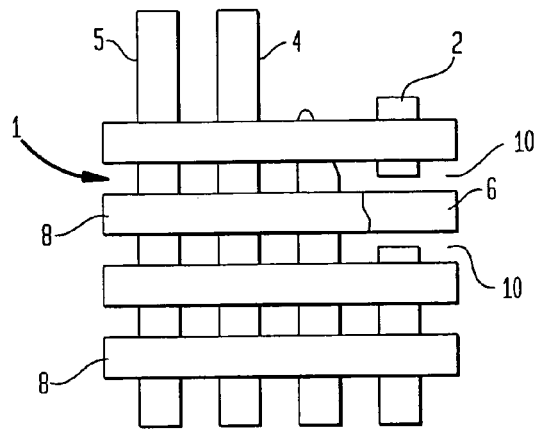
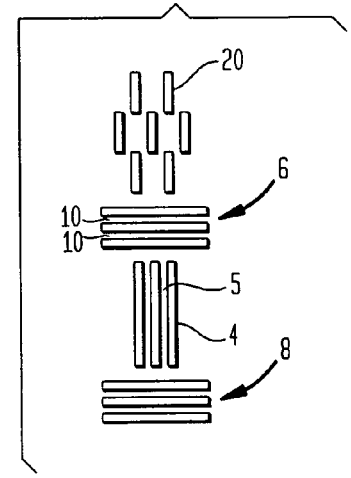
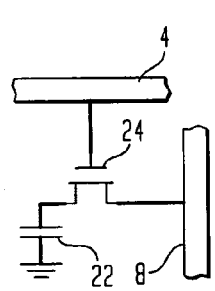
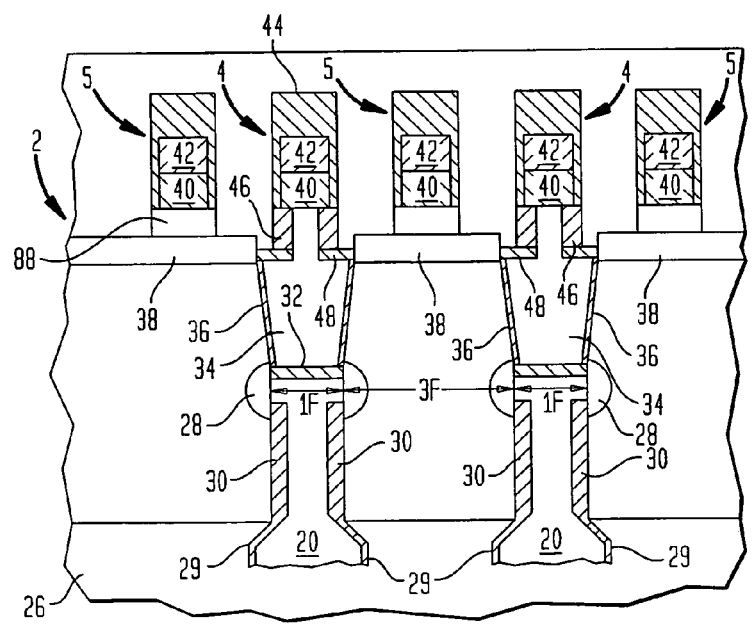

INCLUSION OF LOW-K DIELECTRIC MATERIAL BETWEEN BIT LINES

BACKGROUND OF THE INVENTION

The present invention is directed to memory devices and, more particularly, to dynamic random access memory (DRAM) structures formed in a substrate.

Dynamic random access memory devices (DRAMs) typically include a semiconductor memory cell array formed of a plurality of memory cells arranged in rows and columns and include a plurality of bit lines as well as a plurality of word lines that intersect the bit lines. Each memory cell of the array is located at the intersection of a respective word line and a respective bit line and includes a capacitor for storing data and a transistor for switching, such as a planar or vertical MOS transistor. The word line is connected to the gate of the switching transistor, and the bit line is connected to the source or drain of the switching transistor. When the transistor of the memory cell is switched on by a signal on the word line, a data signal is transferred from the capacitor of the memory cell to the bit line connected to the memory cell or from the bit line connected to the memory cell to the capacitor of the memory cell.

When data stored in one of the memory cells is read onto one of the bit lines, for example, a potential difference is generated between the bit line of the respective memory cell and the bit line of another memory cell which form a bit line pair. A bit line sense amplifier connected to the bit line pair senses and amplifies the potential difference and transfers the data from the selected memory cells to a data line pair.

An advantage of DRAMs over other types of memory technology is their low cost because of the simplicity and scaling characteristics of the memory cell. Though the DRAM memory cell is based on simple concepts, the actual design and implementation of such cells typically requires a highly complex DRAM design and process technology.

An example of current DRAM technology is a buried capacitor DRAM memory in which memory bits are constructed in pairs to allow sharing of a bit line contact. The sharing of the bit line contact significantly reduces the overall cell size. Typically, the memory bit pair includes an active area (AA), a pair of active word lines and a pair of passing/field word lines, a bit line contact, a metal or polysilicon bit line, and a pair of cell capacitors.

The bit line pitch, i.e., the width of the bit line plus the distance between adjacent bit lines, typically determines the active area pitch and the capacitor pitch. The active area width is typically adjusted to maximize the transistor drive and minimize the transistor-to-transistor leakage.

The word line pitch typically determines the space available for the bit line contact, the transistor length, the active area space, and the capacitor length. Each of these dimensions must be optimized to maximize device capacitance, minimize device leakage and maximize process yield.

As semiconductor devices become increasingly smaller, the distance between adjacent bit lines decreases, thereby increasing the capacitance between adjacent bit lines, known as the bit line-to-bit line capacitance. The increased capacitance induces delays which are more critical for such smaller devices because the devices operate at higher speeds so that the time between the read and/or sense signals on the bit line decreases. It is therefore desirable to reduce the bit line-to-bit line capacitance.

The use of low dielectric-constant insulator materials, known as low-k materials, as the insulator between the bit lines in place of TEOS or other insulators has been proposed. However, such low-k materials are typically unable to withstand temperatures above 400° C. and thus cannot withstand the subsequent annealing steps that are carried out at much higher temperatures. Therefore, such low-k materials are presently unsuitable to serve as insulators between the bit lines.

It is therefore desirable to provide a DRAM structure and fabrication process that avoids these problems.

SUMMARY OF THE INVENTION

The present invention provides a process in which an insulating film, such as TEOS, is first provided between the bit lines for the higher temperature processing steps and is subsequently removed and replaced with a low-k material.

In accordance with an aspect of the invention, a dielectric material is incorporated into a semiconductor device. The semiconductor device is fabricated by a process that includes at least one thermal processing step at a temperature greater than a maximum withstand temperature of the dielectric material. The semiconductor device is fabricated at least up to at least the thermal processing step using a further dielectric material that has a maximum withstand temperature greater than the temperature of the thermal processing step. At least a portion of the further dielectric material is removed. A layer of a lower withstand temperature dielectric material is deposited in place of the removed portion of the further dielectric material.

According to another aspect of the invention, a dielectric material is incorporated into an insulator structure that is adjacent to at least one conductive line of a semiconductor device. The insulator structure and the conductive line are fabricated by a process that includes at least one thermal processing step at a temperature greater than a maximum withstand temperature of the dielectric material. The insulator structure and the conductive line are fabricated at least up to the thermal processing step using a further dielectric material that has a maximum withstand temperature greater than the temperature of the thermal processing step. At least a portion of the further dielectric material is removed. A layer of the lower withstand temperature dielectric material is deposited in place of the removed portion of the further dielectric material.

According to a further aspect of the invention, a semiconductor device is fabricated. At least one deep trench is formed within a semiconductor substrate, and a buried plate is formed within a region of a semiconductor substrate that adjoins a bottom of a deep trench. An insulator film is formed along sidewalls of the deep trench, and an upper region of the insulator film is removed. The deep trench is partly filled with doped polysilicon that extends above a remaining portion of the insulator film. The dopants in the polysilicon diffuse through at least one side of the deep trench into an adjoining region of the semiconductor substrate during subsequent thermal processing to form a buried strap region along the side of the deep trench. A trench top oxide layer is formed atop the doped polysilicon, and a gate insulator layer is formed on at least the upper portion of the side of the deep trench. The deep trench is filled with a further polysilicon layer atop the trench top oxide layer. The semiconductor substrate is patterned and etched to form at least one isolation trench that adjoins the deep trench, and the isolation trench is filled with an insulator material. A doped region is formed in a top surface of the semiconductor substrate adjacent to the gate insulator layer of the deep trench. A contact region is formed that connects to the further polysilicon layer. At least one conducting layer is formed atop the contact region to form a first conductive line. A layer of a first dielectric material is deposited atop the surface of the semiconductor substrate, and the first dielectric layer is planarized to the top surface of the first conductive line. A layer of a further dielectric material is deposited atop the first dielectric layer and atop the first conductive line. The further dielectric layer and the first dielectric layer are patterned and etched to form at least one opening therein that includes at least one region that extends down to the doped region adjacent to the gate dielectric. A contact barrier layer is deposited at least at a bottom of the opening, and the contact barrier layer is annealed. The opening is filled with at least one further conducting material to form at least one further conductive line. At least an upper portion of the further dielectric layer is removed to form at least one opening adjacent to the further conductive line. A layer of another dielectric material is deposited at least in the opening adjacent to the further conductive line and has a lower dielectric constant than that of the further dielectric material.

According to a still further aspect of the invention, a semiconductor device is fabricated. A planar gate oxide layer is formed atop a surface of a semiconductor substrate. At least one conducting layer is deposited atop the gate oxide layer. The one or more conducting layers are patterned and etched to form at least two openings therein. Dopants are introduced into the substrate through the openings in the one or more conducting layers to form at least one source region and at least one drain region. A layer of first dielectric material is deposited atop the surface of the semiconductor substrate and is planarized to the top surface of the at least one conducting layer. A layer of a further dielectric material is deposited atop the first dielectric layer and atop the at least one conducting layer. The further dielectric layer and the first dielectric layer are patterned and etched to form at least one opening therein that includes at least one region that extends down to at least one of the source region and the drain region. A contact barrier layer is deposited at least at a bottom of the opening, and the contact barrier layer is annealed. The opening is filled with at least one further conducting layer. At least an upper portion of the further dielectric material is removed to form at least one opening adjacent to the further conducting layer. A layer of another dielectric material is deposited at least in the opening adjacent to the further conductive layer and has a lower dielectric constant than that of the further dielectric material.

The present invention also includes semiconductor devices fabricated in the manner described above.

A semiconductor device is in accordance with yet another aspect of the invention. At least one deep trench is formed within a semiconductor substrate, and a buried plate is formed within a region of the semiconductor substrate adjoining a bottom of the deep trench. An insulator film is formed along a lower portion of the sidewalls of the deep trench, and doped polysilicon partly fills the deep trench and extends above the insulator film. A buried strap region is disposed along at least one side of a deep trench and adjoins the doped polysilicon. A trench top oxide layer is disposed atop the doped polysilicon, a gate insulator layer is formed on at least the upper portion of the side of the deep trench, and a further polysilicon layer is disposed atop a trench top oxide layer and fills the deep trench. At least one isolation trench is formed in the semiconductor substrate and adjoins the deep trench. The isolation trench is filled with an insulator material. A doped region is formed in a top surface of the semiconductor substrate adjacent to the gate insulator layer of the deep trench. A first conductive line is disposed atop and connects to the further polysilicon layer, and the first conductive line is formed of at least one conducting layer. A first dielectric layer extends from the surface of the semiconductor substrate to the top surface of the first conductive line. A further dielectric layer is disposed atop the first dielectric layer and atop the first conductive line and has at least one opening therein that includes at least one region that extends down to the doped region adjacent to the gate dielectric. An annealed contact barrier layer is formed at least at the bottom of the opening, and at least one further conducting material fills a remainder of the opening to form at least one further conductive line. At least an upper portion of the further dielectric layer is of a material that has a lower dielectric constant than that of a remaining portion of the further dielectric layer and that has a maximum withstand temperature lower than a temperature at which the contact barrier layer is annealed.

A semiconductor device is in accordance with still another aspect of the invention. A planar gate oxide layer is disposed atop a surface of a semiconductor substrate. At least one conducting layer is formed atop a gate oxide layer and has at least two openings therein. At least one source region and at least one drain region are disposed in the substrate beneath the openings in the at least one conducting layer. A first dielectric layer extends from the surface of the semiconductor substrate to the top surface of the at least one conducting layer. A further dielectric layer is disposed atop the first dielectric layer and atop the at least one conducting layer and has at least one opening therein that includes at least one region that extends down to at least one of the source regions and the drain region. An annealed contact barrier layer is formed at least at a bottom of the opening, and at least one further conducting layer fills a remainder of the opening. At least an upper portion of the further dielectric layer is of a material that has a lower dielectric constant than that of a remaining portion of the further dielectric layer and that has a maximum withstand temperature lower than a temperature at which the contact barrier layer is annealed.

The foregoing aspects, features and advantages of the present invention will be further appreciated when considered with reference to the following description of the preferred embodiments and accompanying drawings.

BRIEF DESCRIPTION OF THE DRAWINGS

FIGS. 1A and 1B illustrate, in plan view, a memory device architecture, and FIG. 1C is a schematic diagram of a memory cell.

FIG. 2 shows a cross-sectional view of a known memory cell taken through the active region.

DETAILED DESCRIPTION

Figure 3:
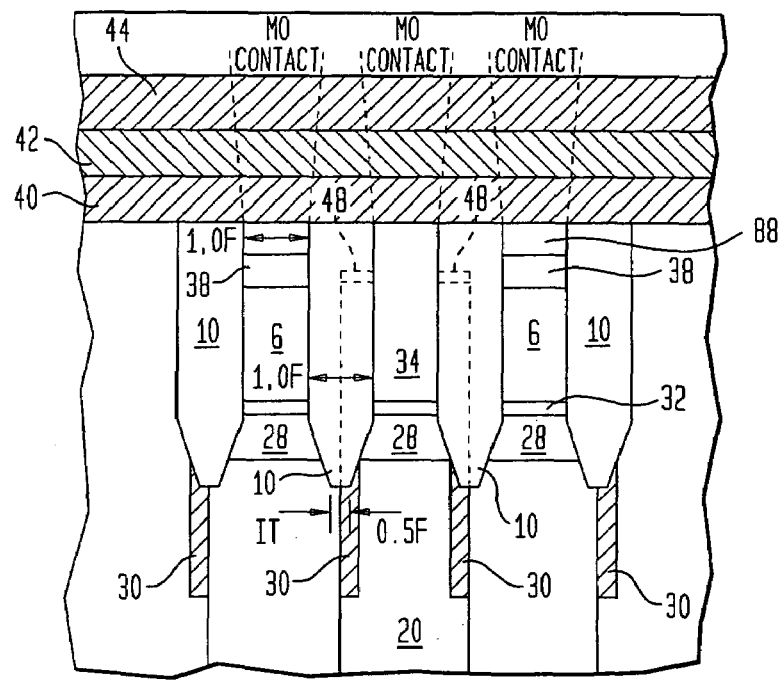
FIG. 3 shows a cross-sectional view of a known memory cell taken perpendicularly to the axis of the active region.

FIGS. 1A and 1B illustrate, in plan view, an 8F2 DRAM memory cell array comprised of plural memory cells. Examples of 8F2 DRAM cells and processes for fabricating such DRAM cells are described in U.S. application Ser. No. 09/888,202, filed Jun. 22, 2001 and titled "Memory Cell Layout with Double Gate Vertical Array Transistor," to Rolf Weis, the disclosure of which is incorporated herein by reference.

FIG. 1A shows various mask patterns of a memory cell array superimposed on one another. FIG. 1B shows each mask pattern of FIG. 1A separately, namely FIG. 1B represents the view of FIG. 1A at four different depths. The topmost pattern of FIG. 1B illustrates an arrangement of a plurality of deep trenches 20. The second pattern from the top in FIG. 1B illustrates the arrangement of the active areas in which doped junctions used for pass transistors are formed. The third pattern from the top illustrates the arrangement of the gate contact patterns or word lines of the cell array, and the bottom pattern illustrates the arrangement of the bit lines of the array.

As described above, the four patterns of FIG. 1B are shown in FIG. 1A superimposed atop one another to form the memory cell array 1. The array 1 is comprised of an arrangement of memory cells 2. Each cell 2 is contacted by two word lines 4 and 5 and by one bit line 8. The cell is comprised of an active area (AA) region formed of silicon or polysilicon 6 which is contacted by the bit line 8 which is comprised of a metal, such as tungsten or highly doped polysilicon. Each AA region is electrically isolated from the next AA region by an isolation trench (IT) 10 which is preferably a trench filled with a field oxide.

The cell 2 is further comprised of a deep trench (DT) region 20 wherein a trench capacitor and a vertical transistor are formed. The deep trench also divides the AA regions. The bit line 8 contacts the AA region on each side of the deep trench at a location where the AA region forms the drain of the pass transistor. The word line 4 passes between the AA regions at a location above the deep trench regions, namely where the AA region is interrupted, to contact the gate of the vertical transistor formed within the trench.

FIG. 1C is a schematic diagram of the known memory cell 2. The cell is comprised of a charge storage capacitor 22 having one plate tied to a reference voltage, which is typically ground or one-half of the bit line voltage, and having its other plate tied to the source of a pass transistor 24. The pass transistor 24 has a drain tied to bit line 8 and a gate tied to word line 4.

FIG. 2 is a cross-sectional view of an example of the known memory cell 2 taken through the AA region shown in FIG. 1. In this example, both the charge storage capacitor 22 and the source of pass transistor 24 shown in FIG. 1C are formed within the deep trench 20, with the pass transistor disposed above the trench capacitor. Alternatively, a horizontal pass transistor, also known as a planar pass transistor, is used in combination with the trench capacitor.

As FIG. 2 shows, the gate of the vertical pass transistor 24 is formed within the upper region of the deep trench 20 above a trench top oxide (TTO) 32. Drain regions for the pass transistor 24 are formed on both sides of the deep trench 20.

A buried plate or buried region 26 forms one plate of the capacitor 22. The buried plate 26 is typically a heavily doped region, preferably n-type, that is formed within a bulk p-type semiconductor substrate. Alternatively, the buried plate 26 is a p-type region formed within an n-type bulk substrate or formed within an n-type well formed within a p-type substrate. A thin dielectric layer 29, such as an oxide or nitride layer or a combination of both or another high-k material, is formed around the periphery of the deep trench 20 and forms the capacitor dielectric. Doped, preferably n-type polysilicon formed within the lower region of the deep trench 20 comprises the other plate of storage capacitor 22. The deep trench 20 also adjoins a heavily doped buried strap region 28 which forms a first doped junction for the pass transistor 24, typically the source region. The buried strap is electrically connected to the n-doped polysilicon formed within the lower region of the deep trench 20, thus forming the connection between the pass transistor 24 and the charge storage capacitor 22. The deep trench 20 also preferably includes a trench collar oxide 30 and a trench top oxide 32 for preventing parasitic current leakages.

In addition to the buried strap source region 28, the pass transistor 24 also includes a doped polysilicon gate region 34 formed within the upper region of the deep trench 20 and the gate oxide 36. The gate oxide 36 is formed on both sides around the polysilicon region 34 in the upper part of trench 20. The pass transistor also includes a drain region 38 which is also formed on both sides of the trench. In this way, the overall gate width is doubled for a given gate length, because the transistor provides two source-to-drain paths, one on each side of the deep trench. Each drain region 38 is connected to the bit line 8 (not shown in FIG. 2) via bit line contacts.

The gate polysilicon region 34 is contacted by the active word line (AWL) 4. The other word lines 5 are also shown in FIG. 2 are connected to other memory cells (not shown), which are referred to as passing word lines (PWL). The word lines 4 and 5 include a low resistive conductor layer atop an optional barrier layer, such as a dual layer conductor formed of a first tungsten nitride (WN) or polysilicon/WN layer 40 over which is formed a tungsten or tungsten silicide (WSi) layer 42. The conductive layers are surrounded by a nitride insulating layer 44 to insulate the word lines from the bit line contacts 80 (shown in FIG. 6H) and from the bit line. Additionally, the gate region 34 is insulated from its adjacent regions, such as from the doped regions 38, by a spacer layer 46 and a cap layer 48. The spacer layer 46 is typically formed of an oxide layer, and the cap layer 48 is typically formed of a nitride layer, though other materials may be substituted. The passing word line 5 is insulated from the doped drain regions 38 by an array top oxide (ATO) 88.

FIG. 3 depicts a cross-sectional view of the memory cell 2 taken perpendicular to the view of FIG. 2, i.e., along the word line 5. The deep trench 20 is illustrated at the center of FIG. 3 as is the trench collar oxide region 30. Four isolation trenches 10 are also illustrated. The isolation trenches are formed between the active regions and separate the bit line contacts from one another. Traversing from left to right in FIG. 3, along word line 5, an isolation trench 10 is first shown, followed by an active area region 6, followed by the deep trench region 20, another isolation trench 10, another active region 6, and so on.

The buried strap region 28 appears to be inside the deep trench region of FIG. 3 but is actually out-diffused from the polysilicon region of the deep trench into the surrounding bulk region of active regions 6. A trench top oxide region 32 is visible inside the deep trench 20 but is shown in the bulk silicon of the active regions 6. Similarly, the doped drain junctions 38 and the ATO 88 are shown in FIG. 3, but these regions are actually behind or in front of the cross-section view illustrated in FIG. 3. Although the nitride cap 48 together with the upper part of the trench 20 are illustrated in the IT region 10, the regions are actually etched away when the IT is etched. The gate oxide 36 is similarly disposed parallel to the plane of the paper in the perspective of FIG. 3 and would not ordinarily be visible. The word line includes a polysilicon layer 40, a tungsten layer 42, and a nitride cap 44. Also shown in phantom line are the bit line (M0) contacts by which the bit line contacts the drain regions 38 of the pass transistor.

Referring back to FIG. 2, each cell is comprised of two transistors. Each of the transistors shares a common gate region 34, but has its own gate oxide 36, source or first doped junction region 28, and drain or second doped junction region 38. The arrangement could also be considered to be a single transistor, operating under a single control signal, but having its source, gate oxide, and drain physically separated into two distinct regions. The drain region 38 of each transistor includes two contact regions 80 (shown in FIG. 6H) to the bit line 6. The logical pass transistor hence has four contacts to the bit line. Also, each pass transistor shares a common doped junction region, namely the drain region 38, with a neighboring transistor.

A process flow for forming the known memory cell is described with reference to FIGS. 4A through 4E, FIGS. 5A and 5B, and FIGS. 6A through 6I.

Figure 4A:
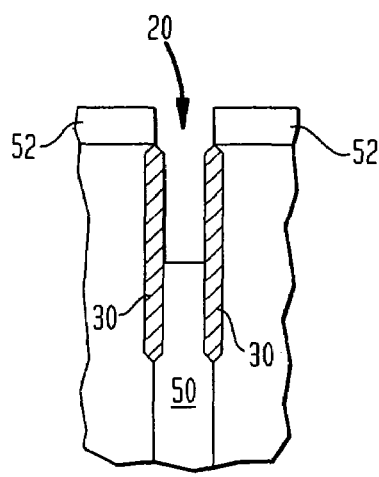
FIGS. 4A through 4E illustrate steps of a known process for fabricating memory cells and arrays.

First, a pad oxide layer (not shown) and a pad nitride layer 52 are deposited atop the substrate, and then a hard mask layer (not shown) is deposited atop the nitride layer 52. The hard mask layer and the pad nitride layer are then patterned and etched using a lithographic step, and the hard mask layer is then used to mask the etching of the deep trench 20. Next, the hard mask layer is removed, and a doped glass layer is deposited along the walls and bottom of the trench as well as atop the nitride layer 52. A further lithographic step is then carried out to pattern and remove the doped glass from atop the nitride layer and from the walls of the upper portion of the trench. An oxide cap is then deposited over the remaining portion of the doped glass, as well as over the walls of the rest of the trench and atop the nitride layer, and an anneal step is carried out to drive dopants from the doped glass into the silicon substrate and form a buried plate. The oxide cap and the doped glass are then removed, and a thin dielectric layer 29, shown in FIG. 2, is deposited along the sides of the trench. The lower portion of the trench is filled with polysilicon to form part of the polysilicon region 50. The top surface of the device is then planarized to remove any portion of the polysilicon that is atop the nitride layer, and the polysilicon is recessed to the intended depth of the collar. The dielectric film is removed from the exposed upper portion of the trench, and the trench collar oxide layer 30 is then deposited and etched back to remove any portion of the trench collar oxide layer that is atop the nitride layer 52. The remainder of the polysilicon layer 50 is next deposited, and the device is again planarized to remove any polysilicon that is atop the nitride layer 52. The nitride layer 52 protects the surrounding silicon during the polysilicon etch step. In FIG. 4A, the deep trench 20 and the trench collar oxide layer 30 are shown. The trench is shown partly filled with the polysilicon 50 that has been recessed back to a desired level within the trench as described above.

Figure 4B:
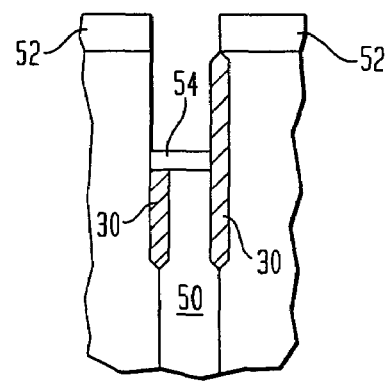

The trench collar oxide is recessed back as shown in FIG. 4B, preferably using a wet etch step. The oxide recess forms a divot at a location where the collar oxide is removed below the level of polysilicon fill 50. A lithographic step may be carried out prior to etching back the trench collar oxide using a cut mask pattern that forms a patterned resist layer which protects one side of each trench during the etch back so that the oxide is etched only along the unprotected side of the deep trench. The oxide remaining along the protected side of the deep trench serves as a barrier for the diffusion of dopants from the subsequently deposited polysilicon layer 54 into the walls of the deep trench and prevents the formation of a buried strap region along the protected side of the trench. As a result, the vertical transistors are only formed along the unprotected side of the trench with the single-sided strap. An optional thin oxidation or nitride deposition may also be performed.

The divot is then filled by again filling the trench with polysilicon and then recessing the polysilicon to the desired level to form the polysilicon layer 54. The polysilicon layer 54 is subsequently doped in high temperature processing steps by the region 50 and the dopant subsequently out-diffuses into the substrate to form the buried strap region 28.

Figure 4C:
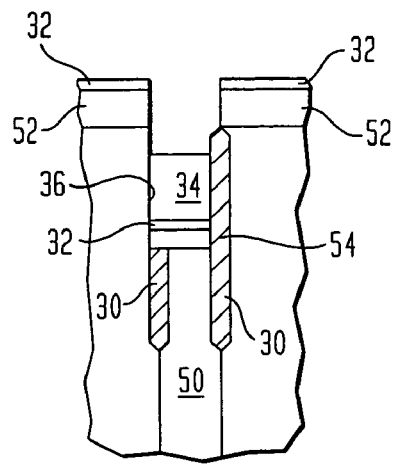

A trench top oxide layer 32 is then formed, as FIG. 4C shows, by first forming a sacrificial oxide layer (not shown) on the sidewalls of the deep trench 20 above the region of polysilicon 54. The trench top oxide (TTO) layer 32 is then deposited using a high density plasma (HDP) process followed by a wet etch back so that the layer 32 remains on the horizontal surfaces. Optionally, a nitride wet etch can be performed to remove the overhang of the nitride layer 52 in the trench 20. After formation of the TTO layer 32, the sacrificial oxide layer is removed from the sidewalls of the trench, thus providing a clean deep trench sidewall surface for subsequent growing of a gate oxide layer 36. After the gate oxide layer 36 is formed, a gate polysilicon layer 34 is deposited within the deep trench, polished by a chemical mechanical polish (CMP) step and then recessed. Preferably, the deep trench is overfilled with the polysilicon and is followed by a CMP step down to the top of the nitride layer 52. The polysilicon is then etched below the surface of the bulk silicon surrounding deep trench 20. The recess depth is a matter of design choice provided that the recess is within the junction depth of the drain 38 to insure junction to gate overlap.

Figure 4D:
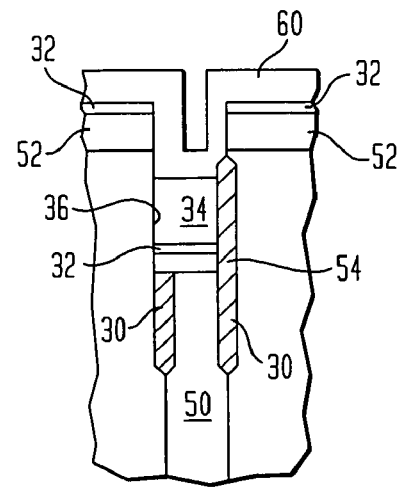

As shown in FIG. 4D, the exposed surfaces of the bulk silicon and of gate polysilicon 34 are then oxidized to form a thin oxide layer, not shown. A nitride liner layer 60 is then formed.

Figure 4E:
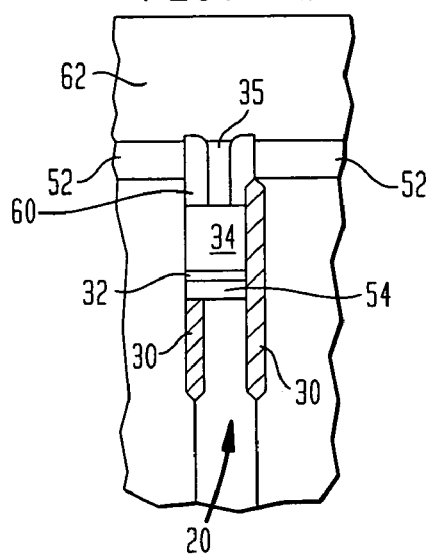

FIG. 4E illustrates a subsequent step in which portions of the nitride liner 60 is etched back to leave a nitride spacer. An oxide clean step then removes any oxide from the exposed surface of gate polysilicon 34. The portions of the TTO layer 32 that are formed atop the nitride layer 52 may also be removed concurrently if not stripped earlier. Additional doped polysilicon is next deposited atop the gate polysilicon region 34, resulting in a polysilicon stud 35 which is preferably in electrical contact with the gate polysilicon layer 34. Preferably, the polysilicon stud layer 35 is overfilled and then wet etched back or, alternatively, subjected to a CMP planarizing step. A hard mask layer 62 is then deposited over the region to protect the trench during subsequent active area processing.

Figure 5A:
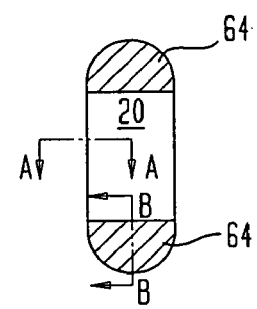
FIGS. 5A and 5B provide plan view detail of a deep trench formed in the active region of the known memory cell fabrication process.

FIG. 5A shows a top-down view of the deep trench 20 prior to the formation of an isolation trench (IT) 10. The deep trench 20 initially extends beyond the boundaries of the overlying active area 6 into what is to become part of the isolation trench region shown by the crosshatched regions 64.

Figure 5B:
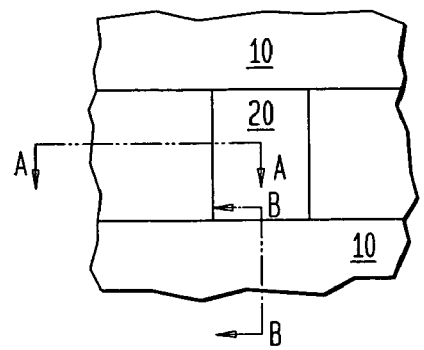

FIG. 5B illustrates the deep trench 20 after the isolation trench 10 is etched. The crosshatched regions 64 and the surrounding silicon have been etched away leaving the active region 6 and the deep trench 20 now bounded on both sides by the isolation trench 10.

Lines A—A and B—B in FIGS. 5A and 5B define two cross-sectional perspectives provided in FIGS. 6A through 6I. The portion of FIGS. 6A through 6I to the left of the dotted vertical line is taken along the axis of bit line region, along the active area (AA) region and corresponds to the perspective along line A—A in FIG. 5B. The portion of FIGS. 6A through 6I to the right of the dotted vertical line is taken perpendicular to the bit line region and corresponds to the perspective along line B—B in FIG. 5B.

Figure 6A:
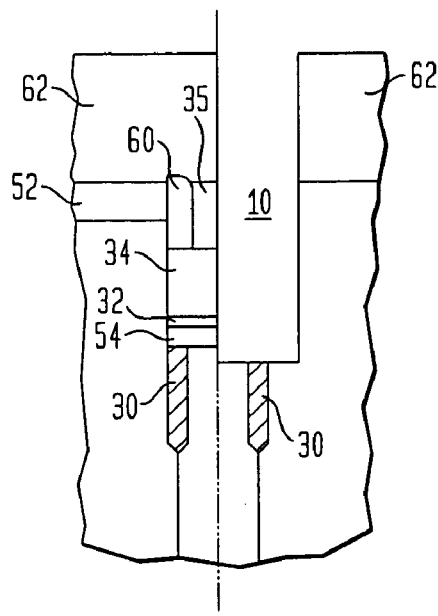
FIGS. 6A through 6I illustrate additional known process steps for fabricating memory cells and arrays.

As described above with reference to FIG. 4B, the portion of the deep trench 20 underlying the bit line region is covered by the hard mask 62 before the isolation trench is etched. The portions lying outside the active regions and the surrounding silicon are exposed, as shown in FIG. 6A, including portions 64 of the deep trench shown in FIG. 5A. The exposed portion are etched, thereby forming the isolation trench 10 which truncates the upper and lower edges of the deep trench 20 by removing the regions 64 shown in FIG. 5A.

Figure 6B:
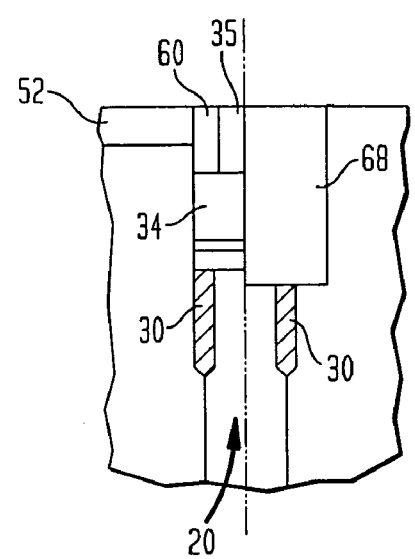

As illustrated in FIG. 6B, the isolation trench 10 is then filled with an insulating oxide 68 and then planarized. The hard mask 62, shown in FIG. 6A, is then removed, and the trench oxide 68 and nitride spacer 60 are planarized to the top of nitride layer 52.

Figure 6C:
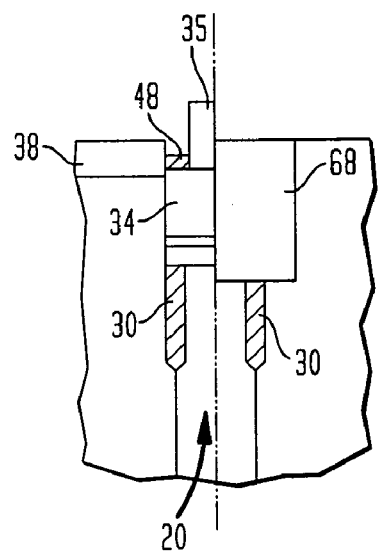

Referring to FIG. 6C, the nitride layer 52 and nitride spacer 60 are substantially removed to leave a nitride cap 48. The isolation trench oxide 68 is also partially etched back to remove any residual oxide layer on the nitride surface and may leave a gate polysilicon stud 35 which extends out above the surface of the nitride and oxide layers. A sacrificial oxide layer is then formed (not shown) and is followed by an ion implantation step to form doped regions of the planar support circuits as well as the doped junction regions 38, shown in FIG. 2, of the vertical gate transistor 24. The sacrificial oxide layer is then removed prior to further processing. During each thermal step, such as the annealing step after the ion implantation step, the dopants within the polysilicon layer 54 in the trench diffuse out into the bulk silicon surrounding the trench to form the buried strap or doped junction 28 shown in FIG. 2.

Figure 6D:
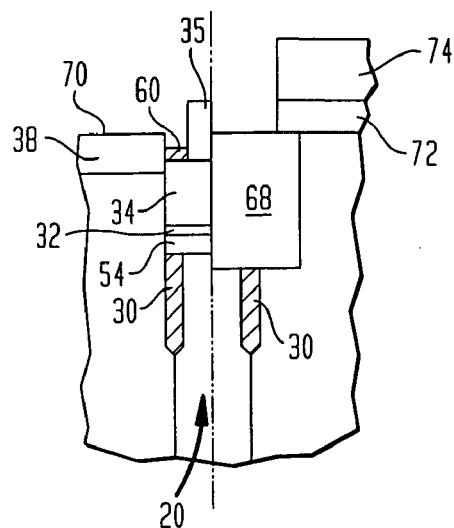

As shown in FIG. 6D, a planar device gate oxide 70 is then formed, and a polysilicon layer 72 is then deposited to form the gate polysilicon layer in the support regions. The polysilicon layer 72 is then patterned using known photolithographic and etching processes. An etch array (EA) mask pattern 74 exposes the active area and deep trench regions to the polysilicon etch while covering the support regions where the planar devices are formed. The resulting polysilicon layer 72 covers only the support regions.

Figure 6E:
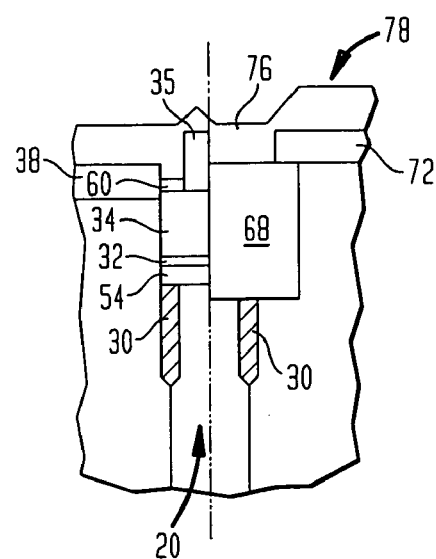

A thick oxide layer 76 is then deposited and patterned using an etch support (ES) mask layer 78, shown in FIG. 6E. The ES mask layer 78 covers the array regions and exposes the support regions so that the oxide layer 76 is etched away in the regions where the polysilicon layer 72 is present and remains only over the memory array areas, though there may be some overlap between the resulting polysilicon layer 72 and the thick oxide layer 76.

Figure 6F:
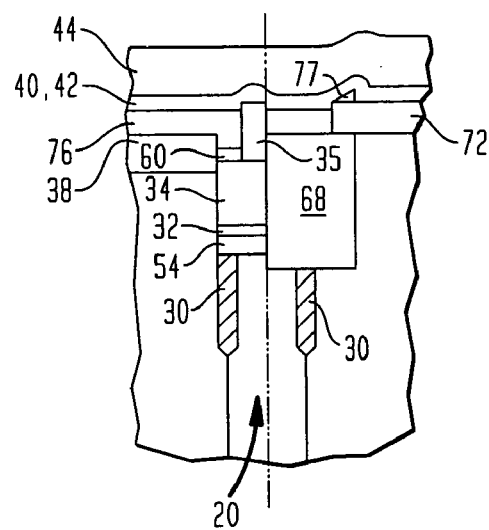

The thick oxide layer 76 is then planarized, resulting in a planar top oxide surface below the level of gate polysilicon stud 35 and the polysilicon layer 72, as shown in FIG. 6F. A portion 77 of the thick oxide layer 76 may remain atop the polysilicon layer 72 when the oxide layer 76 is not etched back entirely in the active regions but appreciably does not degrade performance or yield.

After planarizing the thick oxide layer 76, an oxide clean step is performed to remove any oxide that has been formed over the gate polysilicon 35 so that the word line conductor stack may be formed. The word lines are preferably a multi-layer stack formed of the polysilicon layer 40 and the tungsten layer 42, shown in FIG. 2. Alternatively, the conductors can be formed of a single layer or a combination of layers comprising polysilicon, tungsten, tungsten nitride, tungsten silicon, tantalum nitride, silicided silicon or other well known alternatives. A nitride cap 44 is then formed over the conductor stack.

Figure 6G:
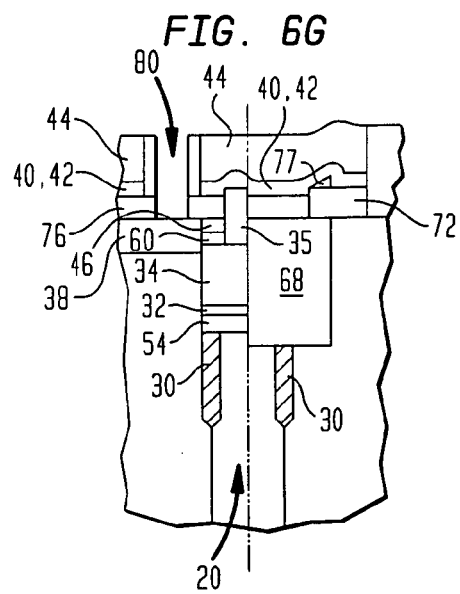

In FIG. 6G, the formation of the word line/support gate stack is illustrated. Oxide and nitride spacers are formed on the sides of the gate stack, and device implants are applied into the support regions.

Figure 6H:
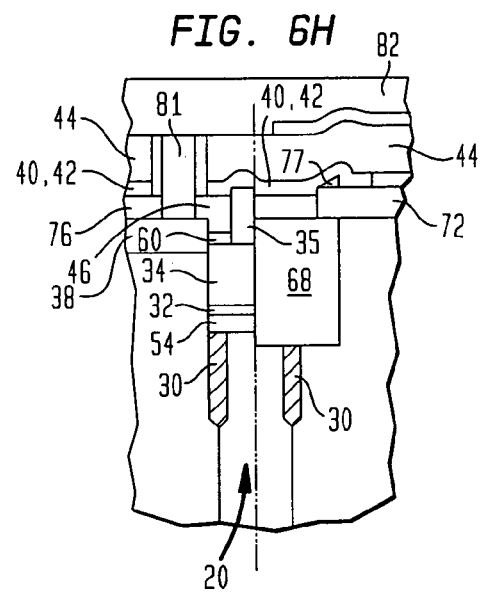

Next, as shown in FIG. 6H, the openings 80 between the gate stack structures are filled with a doped glass 81, such as BPSG, which is then planarized down to the top of the nitride layer 44 of the gate stacks using a CMP step. A thin etch stop layer, such as an LPCVD nitride, may then be deposited. A bit line insulator material 82, such as TEOS, is then deposited atop the planarized doped glass 81 and atop the nitride layer 44. The TEOS is then densified using a known anneal step.

Then, a resist layer is deposited and patterned to form a bit line contact (CB) pattern. The resist then masks an etching step of the bit line insulator layer 82 and of the doped glass layer 81 to form openings, known as vias, down to the drain regions 38 in the silicon substrate on the sides of the deep trenches. The etching of the doped oxide layer 81 is carried out using a selective etching process that leaves the gate conductor insulators 44.

Next, the resist layer is removed, if not removed previously by the etching of the layers 81 and 82, and a polysilicon layer is deposited and planarized to the top of the TEOS layer 81. A junction anneal is then carried out, typically at a temperature of 800 to 950° C.

Then, a further resist layer is deposited and is patterned using a bit line (M0) masking pattern. The openings in the resist layer then serve to mask a further etching of the exposed regions of the TEOS material 82. The TEOS material 82 is only etched partially to the etch stop layer, if present, and forms a bit line trough in the TEOS layer 82. The resist layer is then removed.

Figure 6I:
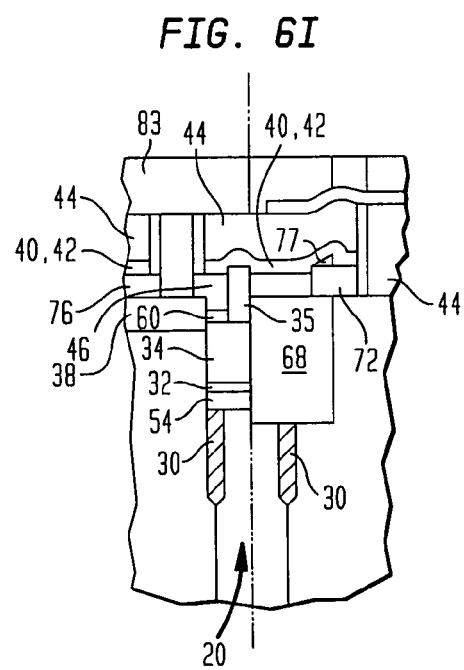

Thereafter, as FIG. 6I shows, a contact barrier metal layer, such as a thin 25 nm layer of Ti, is deposited and annealed, preferably at a temperature of 550° C. Then, another metal layer 83, such as tungsten (W), is deposited and fills the vias and the bit line trough. The metal layer 83 is then planarized down to the top surface of the TEOS insulator layer 82, such as using a CMP step or a damascene process. The metal layer 83 is thereafter annealed, typically at 400° C.

Figure 7:
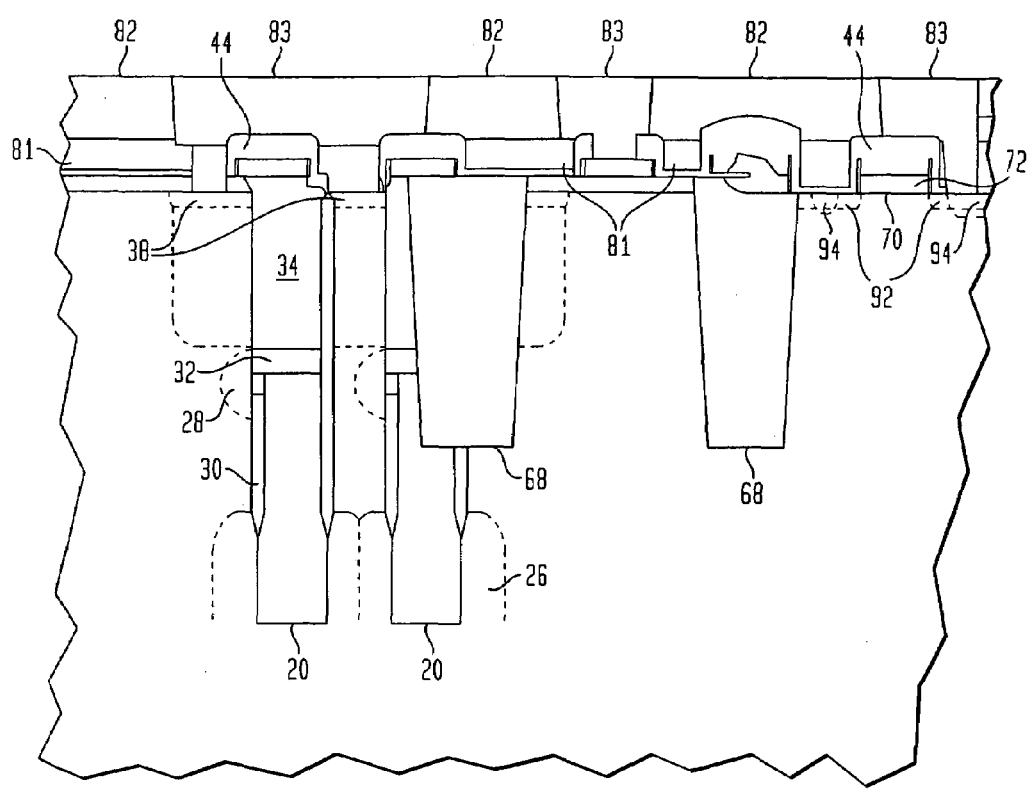
FIG. 7 shows another cross-sectional view of known memory cell device after processing.

FIG. 7 illustrates a vertical device structure resulting from the known process shown in FIGS. 4A–4B, 5A–5B and 6A–6I with like reference numerals representing like structures. FIG. 7 also shows a planar device structure, such as is formed by the known processes described in U.S. application Ser. No. 09/888,193, filed Jun. 22, 2001, now U.S. Pat. No. 6,610,573 which issued on Aug. 26, 2003, to Rolf Weis, the disclosure of which is incorporated herein by reference. Though FIG. 7 shows both vertical and planar transistors on a substrate, the invention is also applicable to devices comprised only of vertical transistors or only of planar transistors that are formed by other processes.

Such planar transistors may be fabricated from a process carried out in the manner described above with reference to FIGS. 4A–4B, 5A–5B and 6A–6C. The ion implantation step that is described with reference to FIG. 6C and which is carried out through a sacrificial oxide layer may also form doped regions of the planar transistors, such as for forming well regions as well as for threshold voltage adjustment. The sacrificial oxide is then removed, and an annealing step is carried out as described.

Then, the planar device gate oxide 70 is formed, the polysilicon layer 72 is deposited, and an etch array (EA) photoresist mask pattern is formed as described above with reference to FIG. 6D. The portions of the polysilicon layer 72 that are exposed by the openings in the mask pattern 74 are etched, and the mask layer 74 is removed. An ion implantation step is then carried out and the implanted dopants annealed to form the shallow doped portion 92 shown in FIG. 7, of the source and drain regions of the planar transistor using the remaining part of the polysilicon layer 72 as a self-aligned mask. The exposed portions of the gate oxide layer 70 are then removed. Alternatively, the ion implant and anneal steps may be carried out after the removal of the portion of the gate oxide layer.

Next, the device is processed in the manner described above with reference to FIGS. 6E–6G to form the multi-layer stack word lines as well as the nitride cap 44 and the oxide and nitride spacers. A further ion implant step is then carried out to form the deep implanted portion 94, shown in FIG. 7, of the planar device source and drain regions. The device is then further processed in the manner described above.

In the above processes, the high dielectric-constant TEOS layer 82 between the various M0 metal lines 83 and increases the bit line-to-bit line capacitance. A low-k material cannot be substituted for the TEOS in the above process because the required junction anneal, contact liner anneal, and M0 anneal steps are carried out at temperatures greater than the low-k material can withstand.

The present invention permits the incorporation of such low-k materials by first carrying out the known process as described above, then etching back the TEOS layer, and thereafter depositing the low-k dielectric material.

Figure 8A:
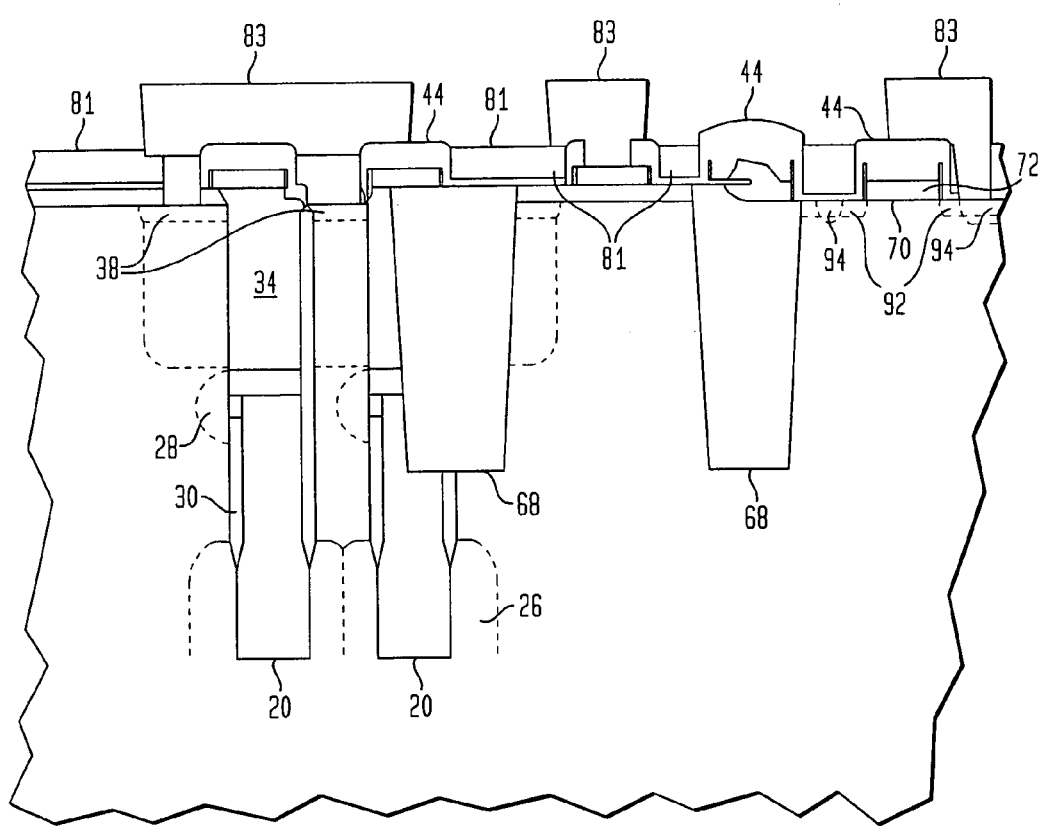
FIGS. 8A through 8B are cross-sectional views showing process steps in accordance with the invention.
Figure 8B:
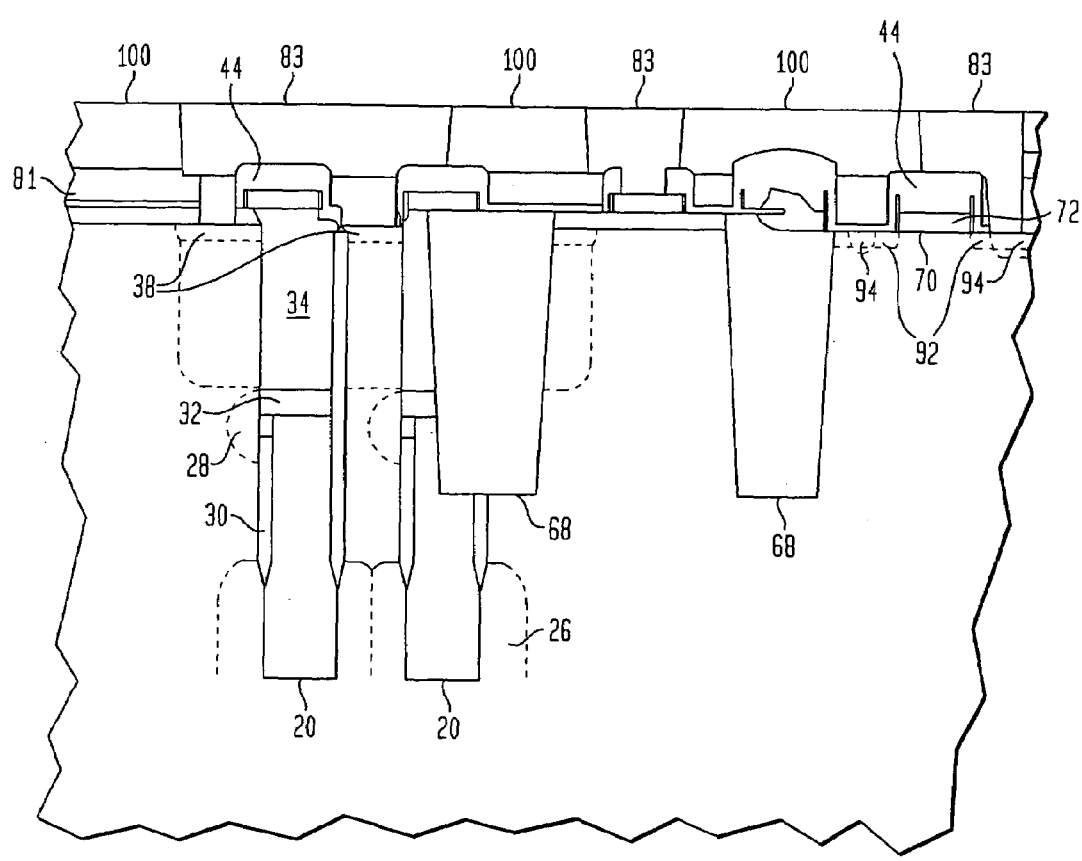

FIGS. 8A-8B illustrate a process of the invention. First, the device is processed in the manner described above with reference to FIGS. 4A–4E, 5A–5B and 6A–6I to obtain the structure shown in FIG. 7. Then, as FIG. 8A shows, the TEOS layer 82 is etched. The etch-back step is carried out using a reactive ion etch (RIE) process that is highly selective to the M0 metal layer so that the TEOS is removed without significant erosion of the metal. Preferably, a $C_4F_8$ etchant gas is used.

Figure 9:
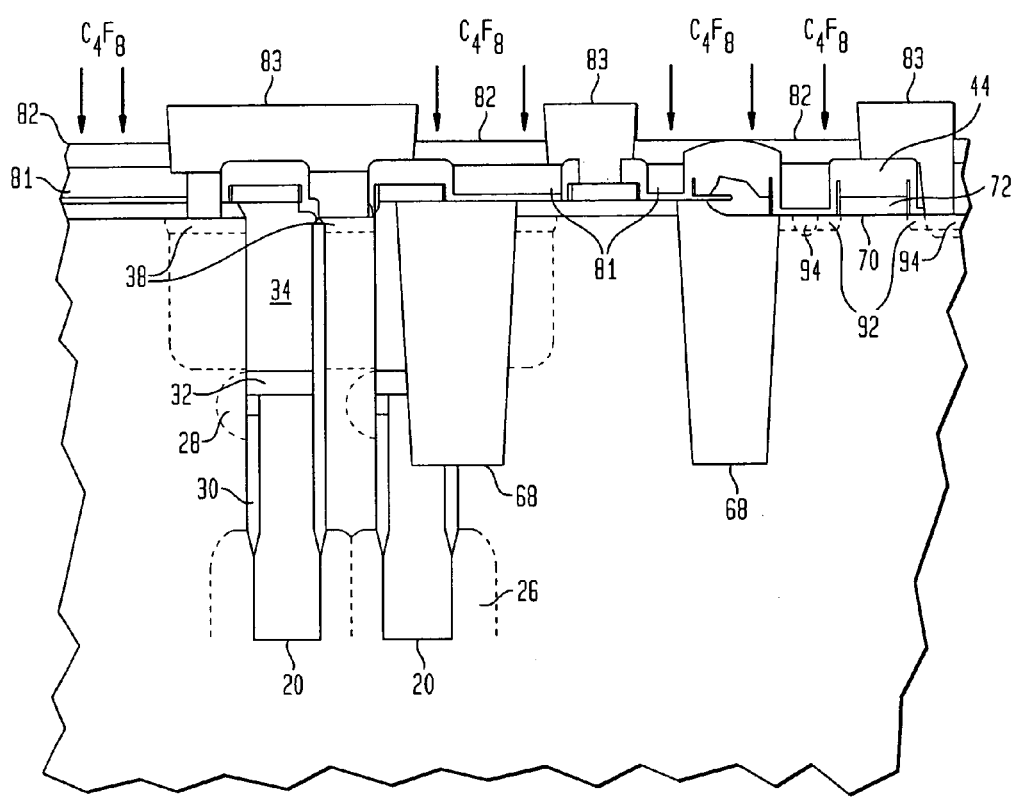
FIG. 9 is a diagram showing an insulator etch process in accordance with an aspect of the invention.
Figure 10:
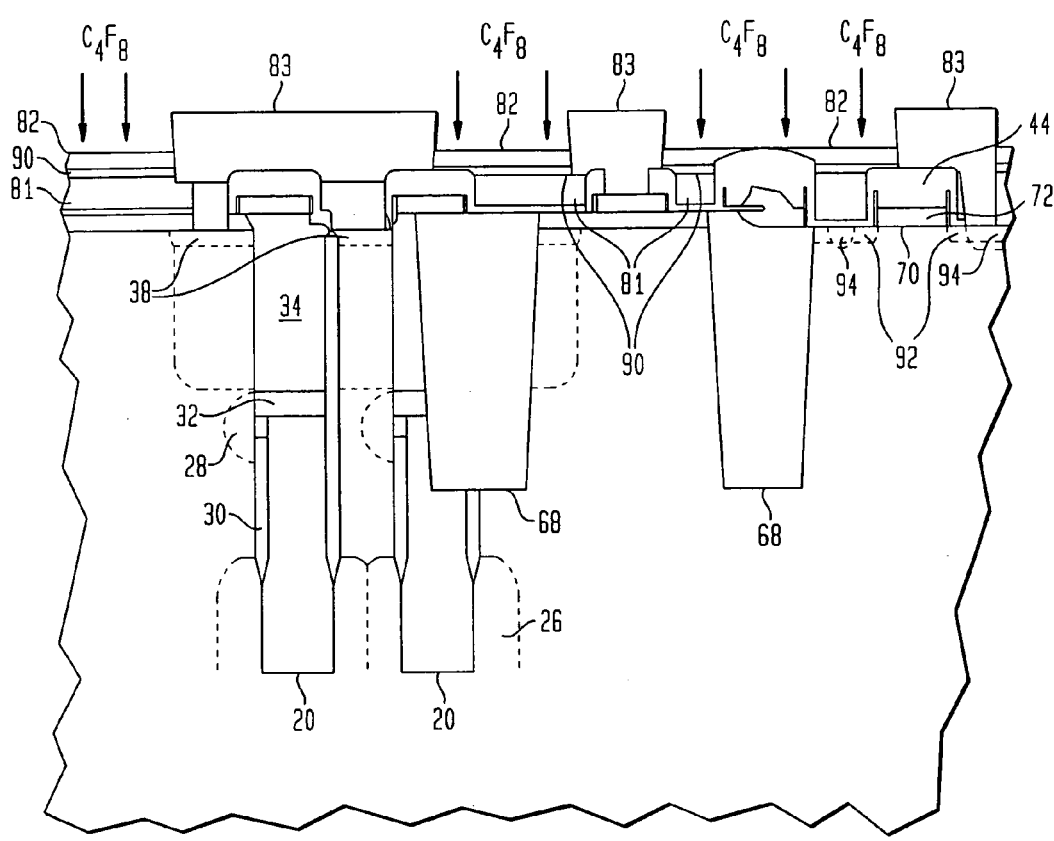
FIG. 10 is a diagram showing an alternative insulator etch process in accordance with the invention.

When the device is fabricated without an etch-stop layer, a timed etching step is carried out so that most or all of the TEOS layer is removed without removing any insulator material that is present below the depth of the bottom of the M0 metal layer, as FIG. 9 shows. Alternatively, when an etch-stop layer 90 is present, the etch-back process is carried out until the etch-stop layer 90 is reached, as FIG. 10 shows.

Next, as shown in FIG. 8B, a low-k dielectric material 100 is deposited, such as using a "spin-on" process or using a physical vapor deposition (PVD) step. The low-k dielectric typically has a dielectric-constant of about 2.7. The low-k dielectric fills in the gaps now present between the M0 metal lines and also extends above the tops of the M0 metal lines as well as atop the M0 metal. The low-k material is then planarized, such as using a CMP step, which removes the portion of the low-k material that is above the tops of the M0 metal. Preferably, when a CMP step is used, the top of the M0 metal layer serves as a stop for the polishing process. Then, an additional low-k dielectric material is deposited to serve as an inter-level dielectric layer between the M0 metal and any further contact and metal levels. Thereafter, the processing is carried out in the known manner.

Alternatively, the TEOS is etched back as described above, and the low-k dielectric material is deposited to fill the gaps between the M0 metal lines also cover the M0 lines. Then, a planarization step, such as a CMP step, is carried out to planarize the top surface of the low-k material but does not polish down the tops of the M0 metal lines. Rather, sufficient low-k material remains after polishing to serve as an internal level dielectric. Preferably, sufficient low-k dielectric material is deposited such that, in addition to the low-k material that is to remain after the polishing step, at least 30–50 nm of additional low-k material is deposited that is removed during the planarization step. As a result, the deposition of the additional low-k dielectric material is not required. Instead, the patterning of contacts and/or metal lines is carried out in the polished low-k dielectric material, with the contact openings connecting down through the low-k dielectric material to the M0 metal lines. Thereafter, the device is processed in the known manner.

The process of the invention therefore permits the incorporation of a low-k dielectric material without exposing the low-k dielectric material to high temperature processing steps. Further, a standard process may be carried out to the M0 metal anneal step. Moreover, the low-k material can serve as both an insulator between the M0 metal lines as well as serve as an inter-level dielectric. Additionally, normal back end processing steps may be carried out.

The process of the invention is also applicable to memory cell arrays or other semiconductor devices formed of vertical transistors, planar transistors, or a combination of vertical or planar transistors. By incorporating the low-k dielectric material into the device structure, the individual transistors may be arranged closer together and thus produce smaller DRAM chips or other device chips.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of incorporating a first dielectric material having a first dielectric constant into a semiconductor device, said semiconductor device being fabricated by a process that includes at least one thermal processing step at a temperature greater than a maximum withstand temperature of said first dielectric material, said method comprising:
    fabricating said semiconductor device at least through the thermal processing step using a second dielectric material having a second dielectric constant greater than said first dielectric constant, and a maximum withstand temperature greater than the temperature of the thermal processing step, said second dielectric material formed atop, an etch stop layer, and disposed adjacent at least one conductive line of said semiconductor device;
    removing at least a portion of said second dielectric material down to said etch stop layer subsequent to said thermal processing step; and then
    depositing a layer of said first dielectric material in place of the removed portion of said second dielectric material.

2. The method of claim 1 wherein said at least one conductive line includes a contact barrier layer, and the thermal processing step is an anneal step of said contact barrier layer.

3. The method of claim 1 further comprising:
planarizing said first dielectric material to a top surface of said conductive line; and
depositing a further layer of said first dielectric material atop said layer of said planarized first dielectric material and atop said conductive line.

4. The method of claim 1 wherein said step of depositing a layer of said first dielectric material includes depositing said layer atop said conductive line; and said method further includes planarizing said layer of said first dielectric material such that a portion thereof remains atop said conductive line and serves as an inter-level dielectric layer.

5. A method of incorporating a first dielectric material having a first dielectric constant into an insulator structure that is adjacent to at least one conductive line of a semiconductor device, said insulator structure and said at least one conductive line being fabricated by a process that includes at least one thermal processing step at a temperature greater than a maximum withstand temperature of said first dielectric material, said method comprising:
fabricating said insulator structure and said at least one conductive line at least through the thermal processing step using a second dielectric material having a second dielectric constant greater than said first dielectric constant and a maximum withstand temperature greater than the temperature of the thermal processing step, said fabricating step comprising:
depositing a first layer of said second dielectric material atop a surface of a semiconductor substrate,
planarizing said first layer of said second dielectric material to a top surface of another conductive line disposed atop said semiconductor substrate,
depositing another layer of said second dielectric material atop said first layer of said second dielectric material and atop said another conductive line,
patterning and etching said another layer of said second dielectric material to form at least one opening therein, and
filling said opening with at least one conducting material to form said at least one conductive line;
removing at least a portion of said second dielectric material subsequent to said thermal processing step; and then
depositing a layer of said first dielectric material in place of the removed portion of said second dielectric material.

6. The method of claim 5 wherein said step of fabricating said insulator structure and said conductive line includes: depositing a contact barrier layer prior to depositing said conductive line, and annealing said contact barrier layer at a temperature greater than said maximum withstand temperature of said first dielectric material.

7. The method of claim 5 wherein an etch stop layer is disposed beneath said second dielectric material; and wherein said step of removing at least a portion of said second dielectric material includes etching down to said etch stop layer.

8. The method of claim 5 wherein said step of removing at least a portion of said second dielectric material includes a timed etching step.

9. The method of claim 5 further comprising:
planarizing said layer of said first dielectric material to a top surface of said conductive line; and
depositing another layer of said first dielectric material atop said layer of said first dielectric material and atop said conductive line.

10. The method of claim 5 wherein said step of depositing a layer of said first dielectric material includes depositing said layer atop said conductive line; and planarizing said layer of said first dielectric material such that a portion thereof remains atop said conductive line and serves as an inter-level dielectric layer.

11. A method of incorporating first dielectric material having a first dielectric constant into an insulator structure that is adjacent to at least one conductive line of a semiconductor device, said insulator structure and said at least one conductive line being fabricated by a process that includes at least one thermal processing step at a temperature greater than a maximum withstand temperature of said first dielectric material, said method comprising:
fabricating said insulator structure and said at least one conductive line at least through the thermal processing step using a second dielectric material having a second dielectric constant greater than said first dielectric constant, and a maximum withstand temperature greater than the temperature of the thermal processing step, said second dielectric material formed atop an etch stop layer,
removing at least a portion of said second dielectric material down to said etch stop layer subsequent to said thermal processing step; and then
depositing a layer of said first dielectric material in place of the removed portion of said second dielectric material.

12. The method of claim 11 wherein said step of fabricating said insulator structure and said conductive line includes: depositing a contact barrier layer prior to depositing said conductive line, and annealing said contact barrier layer at a temperature greater than said maximum withstand temperature of said first dielectric material.

13. The method of claim 11 further comprising:
planarizing said layer of said first dielectric material to a top surface of said conductive line; and
depositing another layer of said first dielectric material atop said layer of said first dielectric material and atop said conductive line.

14. The method of claim 11 wherein said step of depositing a layer of said first dielectric material includes depositing said layer atop said conductive line; and planarizing said layer of said first dielectric material such that a portion thereof remains atop said conductive line and serves as an inter-level dielectric layer.

15. The method of claim 11 wherein said at least one conductive line includes a contact barrier layer, and the thermal processing step is an anneal step of said contact barrier layer.

16. A method of incorporating first dielectric material having a first dielectric constant into an insulator structure that is adjacent at least one conductive line of a semiconductor device, said insulator structure and said at least one conductive line being fabricated by a process that includes at least one thermal processing step at a temperature greater than a maximum withstand temperature of said first dielectric material, said method comprising:
fabricating said insulator structure and said at least one conductive line at least through the thermal processing step using a second dielectric material having a second dielectric constant greater than said first dielectric constant, and a maximum withstand temperature greater than the temperature of the thermal processing step, said fabricating step comprising depositing a contact barrier layer prior to forming said at least one conductive line, and annealing said contact barrier layer at a temperature greater than said maximum withstand temperature of said first dielectric material;

removing at least a portion of said second dielectric material subsequent to said thermal processing step; and then depositing a layer of said first dielectric material in place of the removed portion of said dielectric material.

17. A method of incorporating first dielectric material having a first dielectric constant into an insulator structure that is adjacent to at least one conductive line of a semiconductor device, said insulator structure and said at least one conductive line being fabricated by a process that includes at least one thermal processing step at a temperature greater than a maximum withstand temperature of said first dielectric material, said method comprising:

fabricating said insulator structure and said at least one conductive line at least through the thermal processing step using a second dielectric material having a second dielectric constant greater than said first dielectric constant and a maximum withstand temperature greater than the temperature of the thermal processing step;

removing at least a portion of said second dielectric material subsequent to said thermal processing step; and then depositing a layer of said first dielectric material in place of the removed portion of said second dielectric material;

planarizing said layer of said first dielectric material to a top surface of said conductive line; and depositing another layer of said first dielectric material atop said layer of said first dielectric material and atop said conductive line.

18. A method of incorporating a first dielectric material having a first dielectric constant into a semiconductor device, said semiconductor device being fabricated by a process that includes at least one thermal processing step at a temperature greater than a maximum withstand temperature of said first dielectric material, said method comprising:

fabricating said semiconductor device at least through the thermal processing step using a second dielectric material having a second dielectric constant greater than said first dielectric constant, and a maximum withstand temperature greater than the temperature of the thermal processing step, said second dielectric material formed atop an etch stop layer;

removing at least a portion of second dielectric material down to said etch stop layer subsequent to said thermal processing step; and then depositing a layer of said first dielectric material in place of the removed portion of said second dielectric material.

19. A method of incorporating a first dielectric material having a first dielectric constant into a layer of an electronic structure that includes at least one conductive line of a semiconductor device, said layer of electronic structure and said at least one conductive line being fabricated by a process that includes at least one thermal processing step at a temperature greater than a maximum withstand temperature of said first dielectric material, said method comprising:

fabricating said layer of electronic structure and said at least one conductive line at least through the thermal processing step, said layer comprising having a second dielectric constant greater than said first dielectric constant, and a second dielectric material lying adjacent said at least one conductive line and said second dielectric material having a maximum withstand temperature greater than the temperature of the thermal processing step;

removing at least a portion of said second dielectric material from said layer subsequent to said thermal processing step; and then depositing a layer of said first dielectric material in place of the removed portion of said second dielectric material.

20. The method of claim 19 wherein said step of fabricating said insulator structure and said conductive line includes: depositing a contact barrier layer prior to depositing said conductive line, and annealing said contact barrier layer at a temperature greater than said maximum withstand temperature of said first dielectric material.

21. The method of claim 19 wherein said step of removing at least a portion of said second dielectric material includes a timed etching step.

22. The method of claim 19 further comprising:

planarizing said layer of said first dielectric material to a top surface of said conductive line; and depositing another layer of said first dielectric material atop said layer of said first dielectric material and atop said conductive line.

23. The method of claim 19 wherein said step of depositing a layer of said first dielectric material includes depositing said layer atop said conductive line; and planarizing said layer of said first dielectric material such that a portion thereof remains atop said conductive line and serves as an inter-level dielectric layer.

* * * * *